(12) United States Patent
Kawa

(10) Patent No.: US 7,417,451 B2
(45) Date of Patent: Aug. 26, 2008

(54) LEAKAGE POWER MANAGEMENT WITH NDR ISOLATION DEVICES

(75) Inventor: Jamil Kawa, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 204 days.

(21) Appl. No.: 11/245,933

(22) Filed: Oct. 7, 2005

(65) Prior Publication Data

US 2007/0081378 A1    Apr. 12, 2007

(51) Int. Cl.
    *H03K 17/16* (2006.01)
(52) U.S. Cl. .............................. 326/27; 326/82; 326/33
(58) Field of Classification Search ................ 326/1–87
    See application file for complete search history.

(56) References Cited

U.S. PATENT DOCUMENTS

| | | | | |
|---|---|---|---|---|
| 6,208,171 B1 * | 3/2001 | Kumagai et al. | ............. | 326/121 |
| 6,242,948 B1 * | 6/2001 | Makino | ........................ | 326/81 |
| 6,285,213 B1 * | 9/2001 | Makino | ........................ | 326/81 |
| 6,512,274 B1 | 1/2003 | King et al. | ................... | 257/369 |
| 6,556,071 B2 * | 4/2003 | Notani et al. | ............... | 327/544 |
| 6,724,655 B2 * | 4/2004 | King | ........................... | 365/159 |
| 7,088,143 B2 * | 8/2006 | Ding et al. | ..................... | 326/98 |
| 7,135,886 B2 * | 11/2006 | Schlacter | ...................... | 326/38 |
| 2002/0057123 A1 * | 5/2002 | King | .......................... | 327/498 |

OTHER PUBLICATIONS

"*Circuit Techniques for Gate and Sub-Threshold Leakage Minimization in Future CMOS Technologies*", Rahul Rao, Jeffrey Burns, and Richard Brown, European Solid-State Circuits Conference (ESSCIRC 2003) (Sep. 16-18, 2003).

* cited by examiner

*Primary Examiner*—Don P Le
(74) *Attorney, Agent, or Firm*—Silicon Valley Patent Group; Edward S. Mao

(57) ABSTRACT

A method and system for minimizing sub-threshold leakage in a logic block is disclosed. An NDR isolation device is coupled between the logic block and ground to form a virtual ground node. To put the logic block into sleep mode, the virtual ground control device raises the voltage at the virtual ground node above an isolation voltage, which causes NDR isolation device isolates the virtual ground node from ground. The virtual ground control device can then raise the voltage at the virtual ground node to the positive supply voltage to eliminate sub-threshold leakage currents the logic block. Alternatively, the virtual ground control device can raise the voltage at the virtual ground node to the positive supply voltage minus a retention voltage so that storage elements in the logic block can retain state information while still greatly reducing sub-threshold leakage current.

22 Claims, 8 Drawing Sheets

LEAKAGE POWER MANAGEMENT WITH NDR ISOLATION DEVICES

BACKGROUND

1. Field of the Invention

The invention relates to design of semiconductor chips. More specifically, the invention relates to a method and an apparatus for minimizing sub-threshold leakage current for logic circuits in sleep mode.

2. Related Art

Increasing circuit density is an important component for lowering the cost and increasing the performance of semiconductor chips. Therefore, device sizes in semiconductor chips have been steadily shrinking. However, as devices become smaller, sub-threshold leakage current becomes an increasingly larger part of the overall power consumption of the semiconductor chips. For example, in semiconductor chips with a devices size of 45 nm, sub threshold leakage accounts for approximately 50 percent of the total power consumed.

Sub-threshold leakage current occurs when the gate voltage is below the threshold voltage of a transistor. Thus, sub-threshold leakage occurs when the device is turned off because the gate voltage is below the threshold voltage. Implementing a sleep mode for logic blocks not currently in use can reduce sub-threshold leakage currents. FIG. 1 is a block diagram of a circuit using multi-threshold CMOS (MTCMOS) to implement sleep mode in a logic block. Specifically, a logic block 120 coupled to the positive power supply through a high threshold P-type transistor 110, which provides a virtual positive power node $V_{13}$ VDD for logic block 120. For clarity the voltage at the positive power supply is referred to as positive supply voltage VDD. Logic block 120 is coupled to ground through a high threshold N-type transistor 130, which provides a virtual ground node V_GND for logic block 120. For clarity, the voltage at ground is referred to as ground voltage VSS. A sleep signal SLEEP is applied to the gate of high threshold P-type transistor 110. Conversely, a not sleep signal !SLEEP (which is the inverse of sleep signal SLEEP) is applied to the gate terminal of high threshold N-type transistor 130. In normal operation, sleep signal SLEEP is at logic low and not sleep signal !SLEEP is at logic high. Therefore, both high threshold P-type transistor 110 and high threshold N-type transistor 130 are turned "on". Consequently, the voltage at virtual positive power node V_VDD is very close to the positive supply voltage VDD and the voltage at virtual ground node V_GND is very close to ground voltage VSS. Therefore, logic block 120 can operate normally.

For sleep mode, sleep signal SLEEP is driven to logic high and not sleep signal !SLEEP is driven to logic low. Therefore, both high threshold P-type transistor 110 and high threshold N-type transistor 130 are turned "off". This prevents normal operation of logic block 120 but also serves to reduce but not eliminate the sub-threshold leakage current in logic block 120 because the sub threshold leakage current is proportional to the drain to source voltage (VDS) of the transistors in logic block 120. Specifically, high threshold P-type transistor 110, logic block 120, and high threshold N-type transistor 130 act as a voltage divider ladder. Therefore, the voltage at virtual positive power node is slightly greater than the voltage at virtual ground node V_GND resulting in a small drain to source voltage for the transistors in logic block 120, which allows sub-threshold leakage currents in logic block 120.

Furthermore, storage elements in logic block 120 are not able to store state information (i.e., data) during sleep mode. To prevent loss of state information, redundant storage elements are used in logic block 120. The redundant storage elements are coupled directly to the positive power supply and ground rather than virtual positive power node V—VDD and virtual ground node V_GND. Thus, the redundant storage elements do not go into sleep mode. FIG. 2 shows an inverter 215 and an inverter 218 coupled together to form a storage element 210 from logic block 120. Thus, inverters 215 and 218 receive power from virtual positive power node V_VDD and virtual ground node V_GND. Therefore, when logic block 120 is put into sleep mode, storage element 210 loses the data in storage element 210 prior to entering sleep mode. To retain data during sleep mode, a redundant storage element 220 that is not put into sleep mode is used with each storage element 210. As illustrated in FIG. 2, an inverter 225 and an inverter 228 are coupled to form a redundant storage element 220. Redundant storage element 220 is coupled to storage element 210 through a pass gate 230. Redundant storage element 220 mirrors the data in storage element 210 during normal operation of logic block 120. However, unlike inverters 215 and 218, inverters 225 and 228 are powered directly from the positive power supply and ground. Therefore, when logic block 120 enters sleep mode, redundant storage element 220 stores the state of storage element 210 prior to entering sleep mode. When logic block 120 leaves sleep mode, redundant storage element 220 resets the data in storage element 210.

While redundant storage elements prevents loss of state information during sleep mode, the cost in terms of silicon resources for redundant storage elements is enormous. In addition to the area for the redundant storage elements, additional silicon area is used for routing the separate power lines to the redundant storage elements. Furthermore, the redundant storage elements consume additional power. Hence there is a need for method and system to reduce sub-threshold leakage currents with the ability to maintain state information.

SUMMARY

Accordingly, the present invention provides a method and system to eliminate sub-threshold leakage current in a logic block during sleep mode. Alternatively the sub-threshold leakage current can be greatly reduced while allowing state information to be retained in the storage elements of the logic block during sleep mode without the need for redundant storage elements. Specifically, in accordance with one embodiment of the present invention, the logic block is coupled to the positive power supply and a virtual ground node. An NDR isolation device is coupled between the virtual ground node and ground. A virtual ground control device is coupled to the positive power supply and the virtual ground node. To put the logic block into sleep mode, the virtual ground control device raises the voltage at the virtual ground node above an isolation voltage, which causes the NDR isolation device to isolate the virtual ground node from ground. Then, the virtual ground control device can raise the voltage at the virtual ground node to the positive supply voltage to eliminate sub-threshold leakage current in the logic block. Alternatively, the virtual ground control device can raise the voltage at the virtual ground node to the positive supply voltage minus a retention voltage, which would greatly reduce the sub-threshold leakage current in the logic block while also allowing storage elements in the logic block to retain state information. The present invention will be more fully understood in view of the following description and drawings

DETAILED DESCRIPTION

Figure 1:
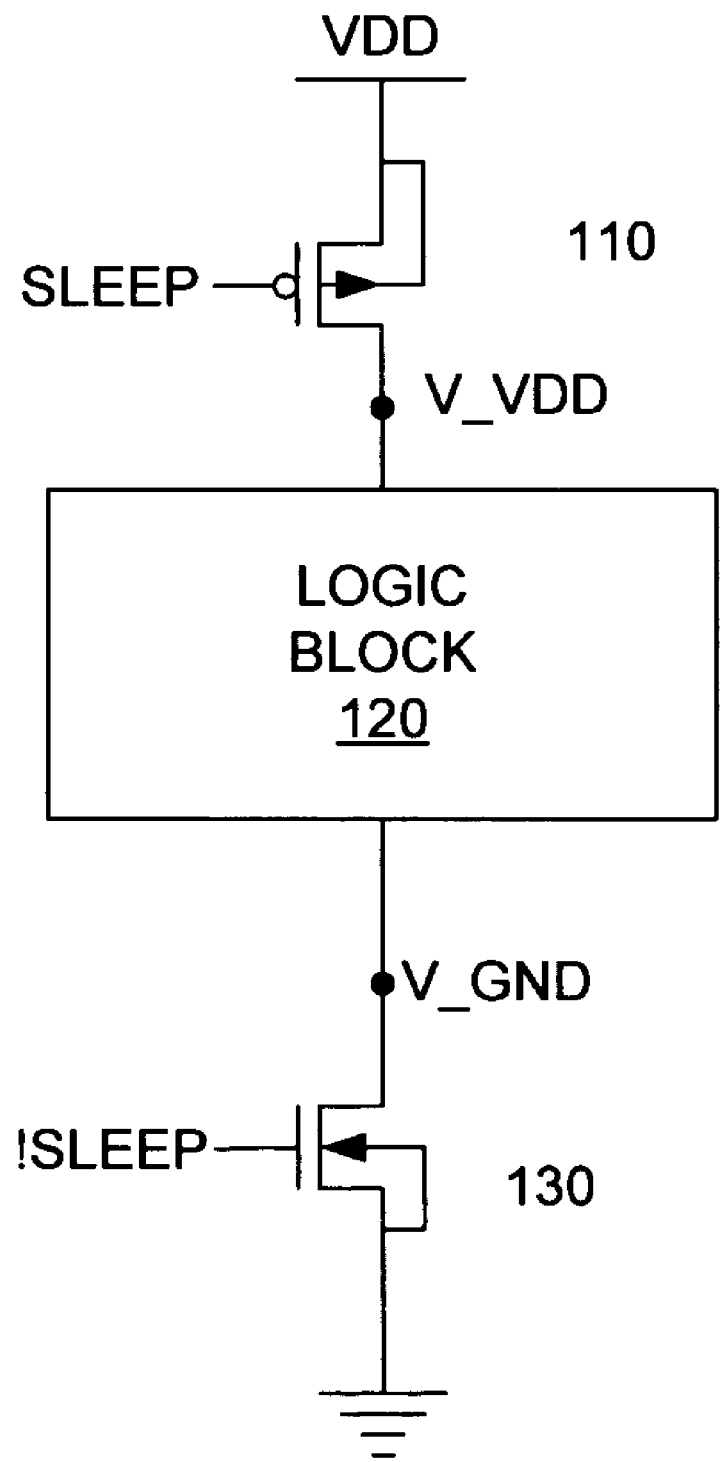
FIG. 1 is a block diagram of a circuit using a conventional method to reduce sub-threshold leakage currents in a logic block during sleep mode.
Figure 2:
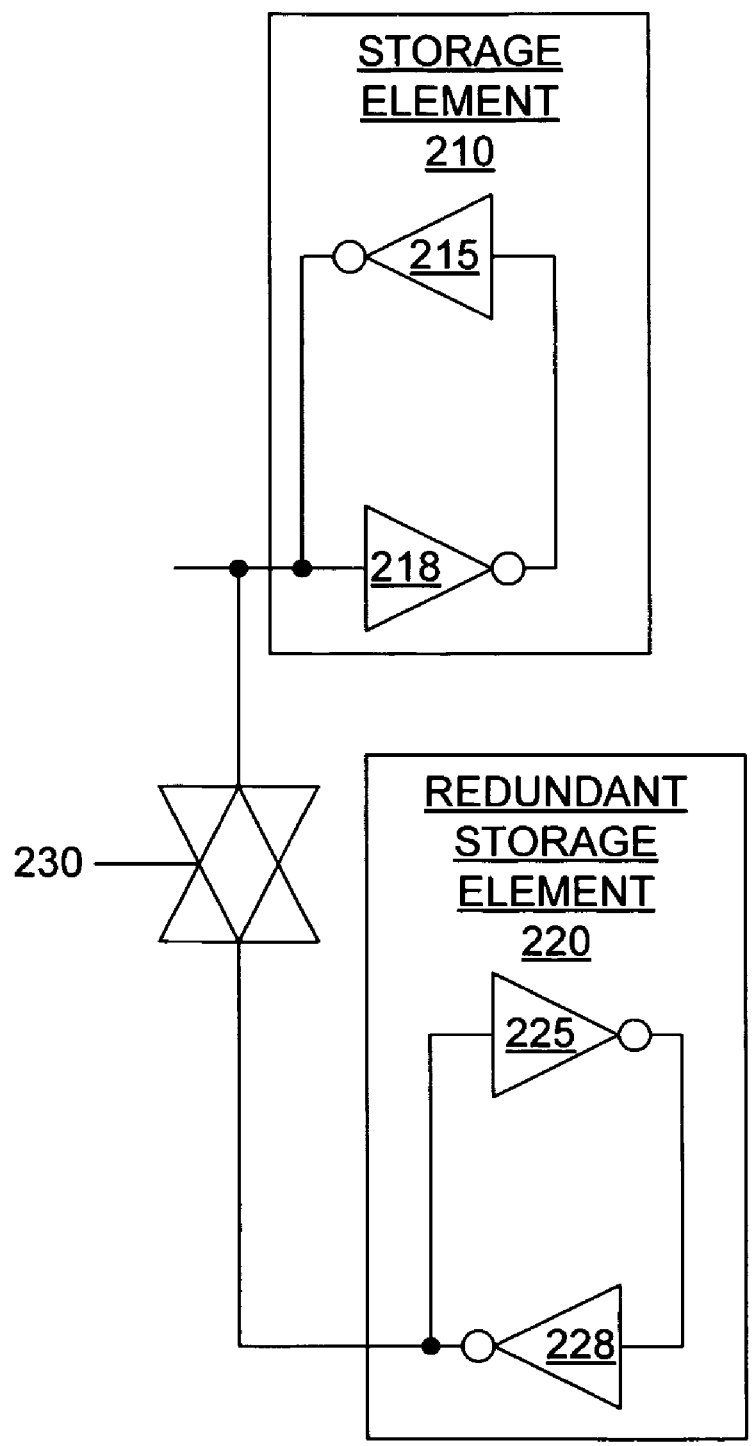
FIG. 2 is a block diagram of a circuit using a conventional method to save state information in the logic block during sleep mode.
Figure 3:
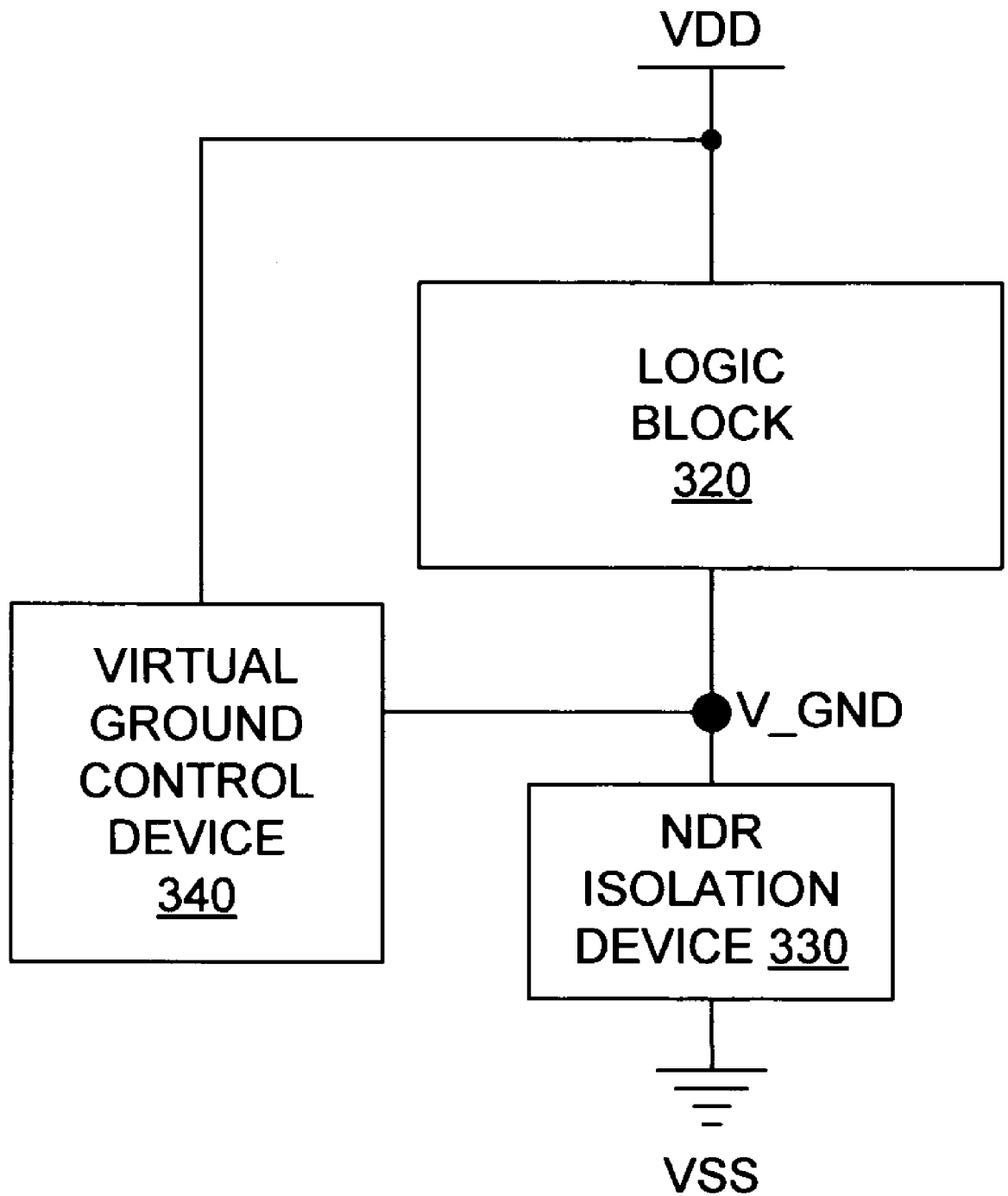
FIG. 3 is a block diagram of an embodiment of the present invention used to reduce sub-threshold leakage current in a logic block during sleep mode.

As explained above, sub-threshold leakage current is becoming a significantly large part of the overall power consumption of an integrated circuit. The present invention can eliminate sub-threshold leakage current in a logic block by better isolating a logic block than conventional methods of reducing sub-threshold leakage current. FIG. 3 is a block diagram of a circuit in accordance with one embodiment of the present invention that minimizes sub-threshold leakage current in a logic block during sleep mode. Specifically in FIG. 3, a logic block 320 is coupled between the positive power supply and a virtual ground node V_GND. Virtual ground control device 340 and an NDR isolation device 330 control the voltage at virtual ground node V_GND. Specifically, NDR isolation device 330, which is coupled between virtual ground node V_GND and ground, can either pull virtual ground node V_GND to ground voltage VSS or can isolate virtual ground node V_GND from ground. Virtual ground control device 340, which is coupled the positive power supply and virtual ground node V_GND, can pull the voltage at virtual ground VDD above an isolation voltage V_ISO, which causes NDR isolation device 330 to isolate virtual ground from actual ground. To exit sleep mode, virtual ground control device 340 lowers the voltage at virtual ground node V_GND to below isolation voltage V_ISO, which allows NDR isolation device 330 to quickly reduce the voltage at virtual ground node V_GND to ground voltage VSS.

Figure 4A:
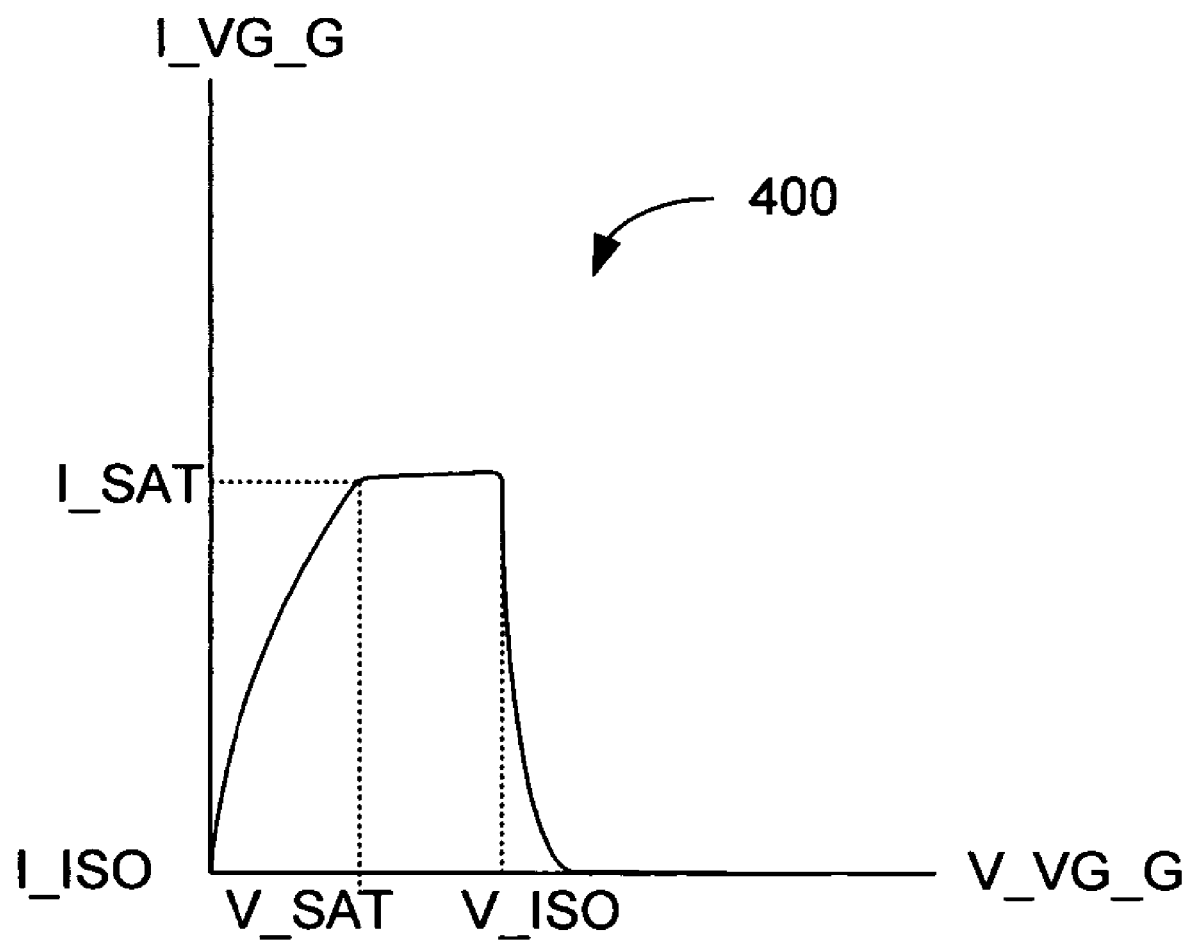
FIG. 4(a) is a graph illustrating the current versus voltage (I-V) characteristics of a negative differential resistance (NDR) device used with some embodiments of the present invention.

FIG. 4(a) is a graph 400a of the current versus voltage of one embodiment of NDR isolation device 330. Specifically, graph 400a shows the virtual ground to ground current I_VG_G through NDR isolation device 330 versus the virtual ground to ground voltage V_VG_G. As virtual ground to ground voltage V_VG_G increases from zero volts, virtual ground to ground current I_VG_G quickly rises towards a saturation current I_SAT at a saturation voltage V_SAT. Then as virtual ground to ground voltage V_VG_G increases from saturation voltage V_PL to an isolation voltage V_ISO, virtual ground to ground current I_VG_G remains essentially at saturation current I_SAT. However, as virtual ground to ground voltage V_VG_G increases past isolation voltage V_ISO, virtual ground to ground current I_VG_G declines exponentially to an isolation current I_ISO, which is practically zero. Further, increases in virtual ground to ground voltage V_VG_G above isolation voltage V_ISO does not significantly change virtual ground to ground current I_VG_VC, which remains at isolation current I_ISO.

Figure 4B:
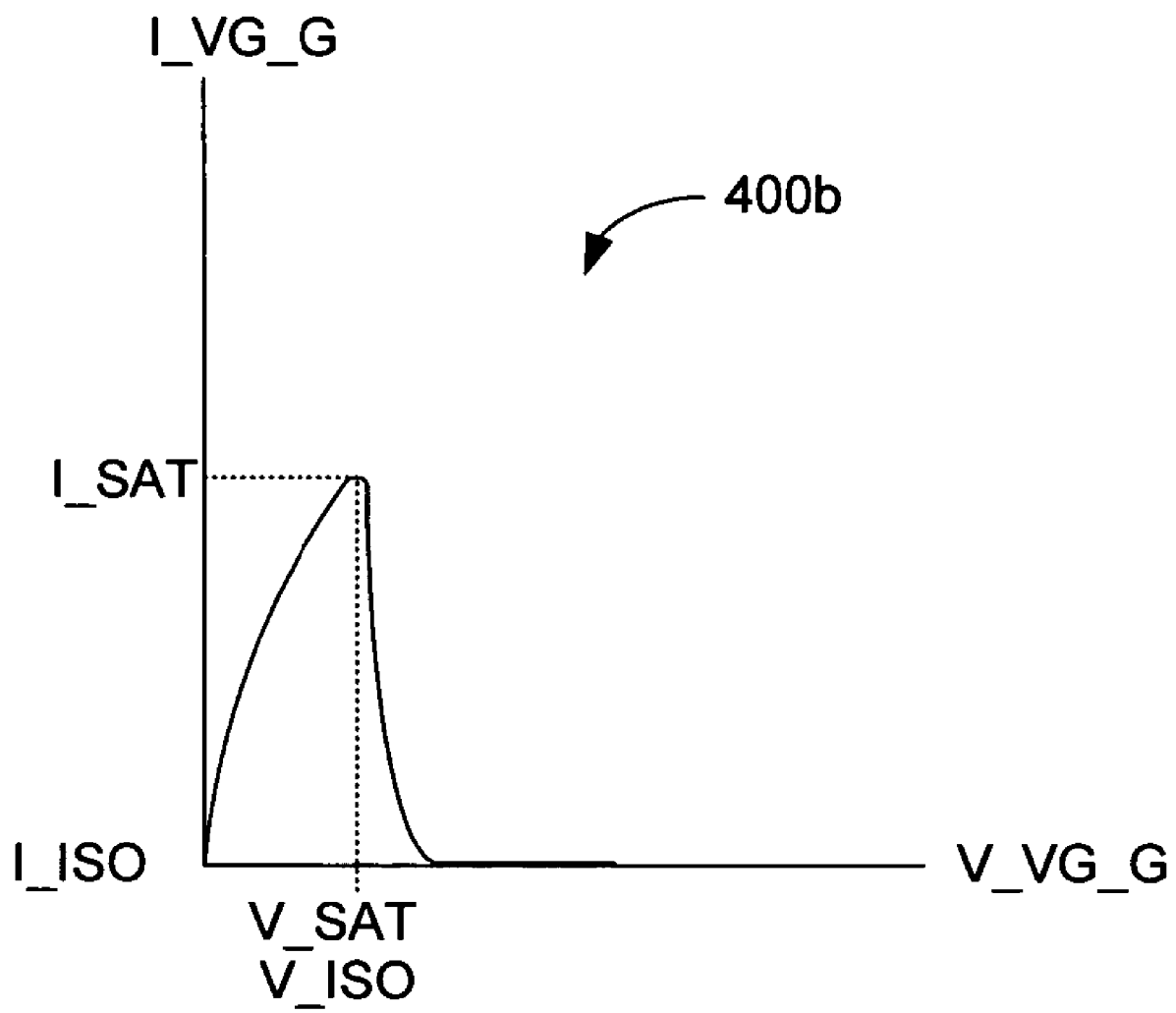
FIG. 4(b) is a graph illustrating the current versus voltage (I-V) characteristics of a negative differential resistance (NDR) device used with some embodiments of the present invention.

FIG. 4(b) is a graph 400b of the current versus voltage of another embodiment of NDR isolation device 330. Like graph 400a (FIG. 4(a)), graph 400b also shows the virtual ground to ground current I_VG_G through NDR isolation device 330 versus the virtual ground to ground voltage V_VG_G. As virtual ground to ground voltage V_VG_CG increases from zero volts, virtual ground to ground current I_VG_G quickly rises towards a saturation current I_SAT at a saturation voltage V_SAT. However, unlike in FIG. 4(a), virtual ground to ground current I_VG_G begins to exponentially decline as soon as virtual ground to ground voltage V_VG_G increases from saturation voltage V_SAT. Thus, in the embodiment of FIG. 4(b) isolation voltage V_ISO is equal to saturation voltage V_SAT. As virtual ground to ground voltage V_VG_G increases past saturation voltage V_SAT (which is also equal to isolation voltage V_ISO), virtual ground to ground current I_VG_G declines exponentially to an isolation current I_ISO, which is practically zero. Further, increases in virtual ground to ground voltage V_VG_G above saturation voltage V_SAT does not significantly change virtual ground to ground current I_VG_VC, which remains at isolation current I_ISO.

Depending on the specific embodiment of NDR isolation device 330, saturation current I_SAT is usually controlled by a bias signal (not shown). Generally, isolation voltage V_ISO is approximately half of positive supply voltage VDD. In a specific embodiment of the present invention, where positive supply voltage VDD is equal to 0.9 volts, saturation voltage V_SAT is equal to 0.45 volts, saturation current I_SAT is equal to 300 uA/um, and isolation current I_ISO is equal to 5 nA/um.

Figure 5:
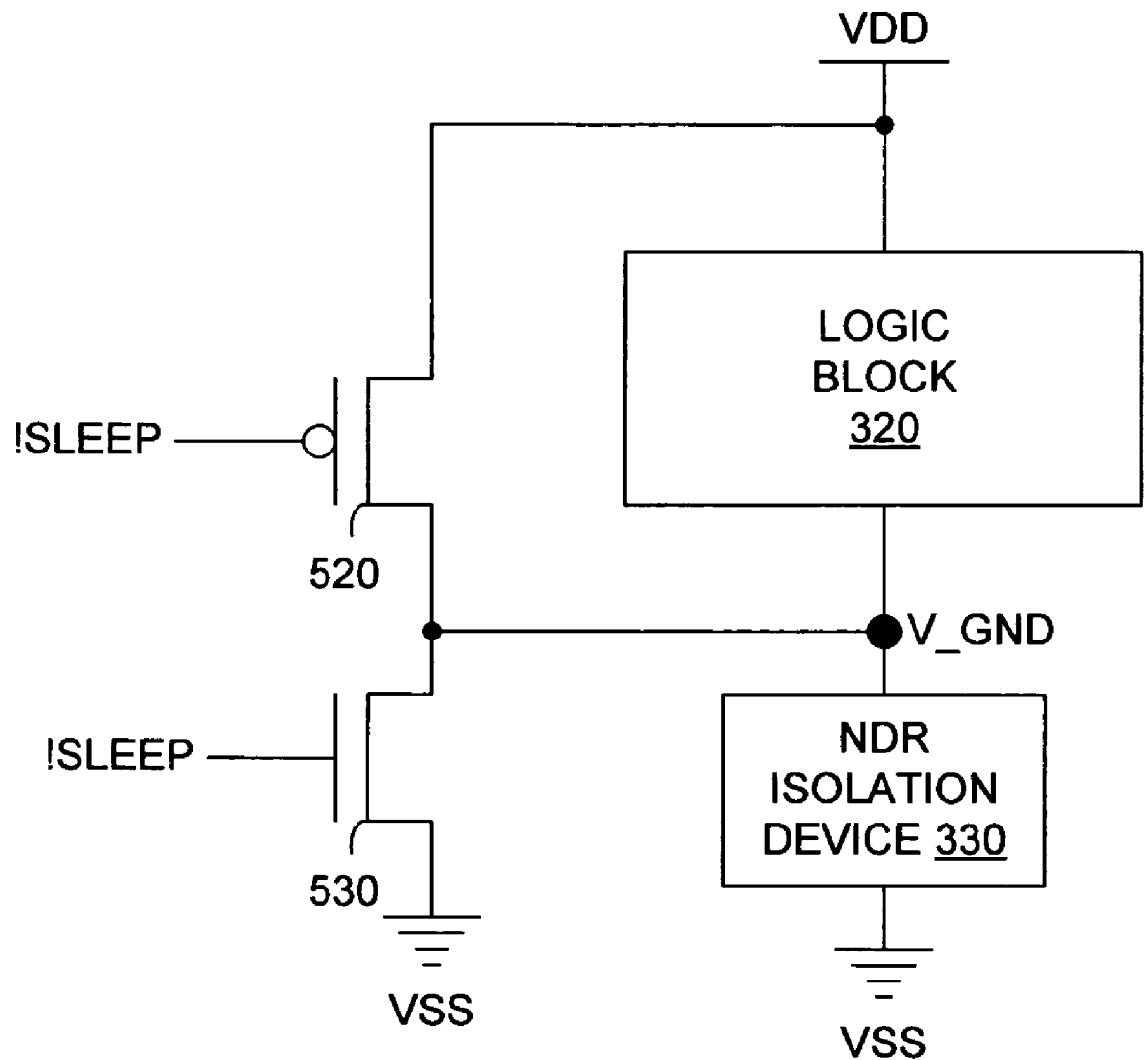
FIG. 5 is a block diagram of another embodiment of the present invention used to reduce sub-threshold leakage current in a logic block during sleep mode.

Thus, when virtual ground control device 340 (FIG. 3) pulls the voltage at virtual ground node V_GND above isolation voltage V_ISO, NDR isolation device prevents any current flow from virtual ground node V_GND to ground. As explained above, sub-threshold leakage current is proportional to the source drain voltage (Vds) of the transistors in logic block 320. Therefore, sub-threshold leakage in logic block 320 can be minimized by raising the voltage at virtual ground node V_GND as close to positive supply voltage VDD as possible. To restore normal operations, virtual ground control device 340 lowers the voltage at virtual ground node V_GND to less than isolation voltage V_ISO of NDR isolation device 330. Therefore, as illustrated in FIG. 5, in one embodiment of the present invention virtual ground control device 340 includes a P-type transistor 520, as a pull-up device, and a long channel weak N-type transistor 530, as a pull-down device. Specifically, P-type transistor 520 has a first power terminal coupled to the positive power supply, a second power terminal coupled to virtual ground node V_GND, and a control terminal coupled to receive not sleep signal !SLEEP. Long channel weak N-Type transistor 530 has a first power terminal coupled to virtual ground node V_GND, a second power terminal coupled to ground, and a control terminal coupled to receive not sleep signal !SLEEP.

When not sleep signal !SLEEP is at logic low (i.e. sleep mode is enabled), P-type transistor 520 is turned on and long channel weak N-type transistor 530 is turned off. Therefore, P-type transistor 520 begins to raise the voltage at virtual ground node V_GND. Once the voltage at virtual ground node V_GND passes isolation voltage V_ISO, NDR isolation device 330 isolates virtual ground node V_GND from ground. Then, P-type transistor 340A is able to pull the voltage at virtual ground node V_GND to positive supply voltage VDD. Therefore, sub-threshold leakage currents in logic block 320 are eliminated because the drain source voltage of the transistors in logic block 320 is zero. As explained in more detail below, long channel weak N-Type transistor 530 is used to pull down the voltage at virtual ground node V_GND when exiting sleep mode. When exiting sleep mode, P-type transistor 520 is turned off, therefore if the saturation current of long channel weak N-type transistor 530 is equal to or greater than the leakage current of logic block 320 and P-type transistor 520, then long channel weak N-type transistor 530 is able to lower the voltage at virtual ground node V_GND. Because long-channel weak N-type transistor 530 can have a very low saturation current and is turned off, long-channel weak N-type transistor 530 does not provide a significant leakage path when logic block 320 is in sleep mode.

To exit sleep mode, sleep signal SLEEP is driven to logic low and not sleep signal !SLEEP is driven to logic high. Therefore, P-type transistor 520 is turned off and long-channel weak N-TYPE transistor 530 is turned on. As long as, the saturation current of long-channel weak N-Type transistor 530 is greater than or equal to the combined leakage currents of logic block 320 and P-type transistor 520, long-channel weak N-type transistor 530 can pull the voltage at virtual ground V_GND below isolation voltage V_ISO, at which point isolation NDR isolation device 330, rapidly pulls the voltage of virtual ground node V_GND to ground voltage VSS.

Figure 6:
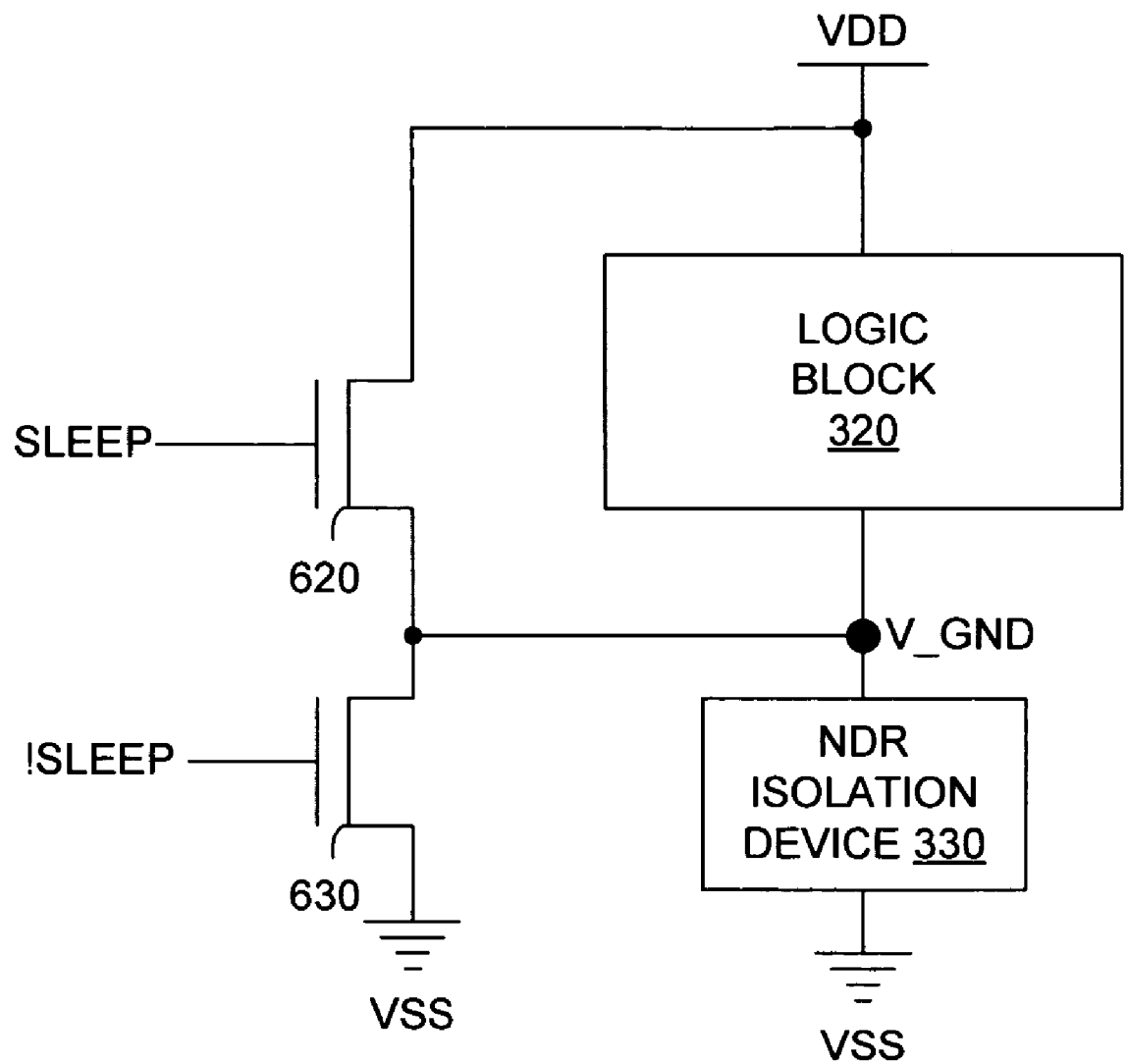
FIG. 6 is a block diagram of another embodiment of the present invention used to reduce sub-threshold leakage current in a logic block during sleep mode.

While the embodiment of FIG. 5, eliminates sub-threshold leakage currents in logic block 320, retention of data in logic block 320 is still a problem. Therefore, in another embodiment of the present invention, virtual ground node V_GND is pulled to positive supply voltage VDD minus a retention voltage V_R. Therefore, the source to drain voltage of the transistors in logic block 320 is equal to retention voltage V_R. A transistor having a drain source voltage equal to or greater than the threshold voltage of the transistor is able to maintain minimal functionality. Therefore, storage elements in logic block 320 are able to retain the state information if retention voltage V_R is greater than the threshold voltage of the transistors in logic block 320. Therefore, in one embodiment of the present invention virtual ground control device 340 is a N-type transistor 620, as the pull-up device, which is illustrated in FIG. 6. The embodiment of FIG. 6 also includes a long channel weak N-type transistor 630, as a pull-down device. Specifically, N-type transistor 620 has a first power terminal coupled to the positive power supply, a second power terminal coupled to virtual ground node V_GND, and a control terminal coupled to receive sleep signal SLEEP. Long channel weak N-Type transistor 630 has a first power terminal coupled to virtual ground node V_GND, a second power terminal coupled to ground, and a control terminal coupled to receive not sleep signal !SLEEP.

When sleep signal SLEEP is at logic high (i.e. sleep mode is enabled), N-type transistor 620 is turned on and long channel weak N-type transistor 630 is turned off. Therefore, N-type transistor 620 begins to raise the voltage at virtual ground node V_GND. Once the voltage at virtual ground node V_GND passes isolation voltage V_ISO, NDR isolation device 330 isolates virtual ground node V_GND from ground. In general, N-type transistors are not as efficient at passing positive voltage (i.e. logic highs) as P-type transistors. Therefore, N-type transistor 620 only drives a voltage equal to the positive supply voltage VDD minus the threshold voltage N-type transistor 620. Therefore, N-type transistor 620 pulls the voltage at virtual ground node V_GND to positive supply voltage VDD minus the threshold voltage of N-type transistor 620, i.e. the retention voltage V_R is equal to the threshold voltage of N-type transistor 620. Sub-threshold leakage currents in logic block 320 are greatly reduced because the drain source voltage of the transistors in logic block 320 is reduced to the threshold voltage of N-type transistor 620. As long as the threshold voltage of N-type transistor 620 is greater than the threshold voltage of the transistors of logic block 320, the storage elements in logic block 320 are able to retain the state information. Therefore, the embodiment of FIG. 6 does not require redundant storage elements to maintain state information.

In some embodiments of the present invention, a series of N-type transistors are used as the pull down device. When a series of N-type transistors are used the voltage across logic block 320 is equal to the sum of the threshold voltages of the series of N-type transistors. Thus, as long as the sum of the threshold voltages of the series of N-type transistors is greater than the threshold voltage of the transistors in logic block 320, storage elements in logic block 320 can maintain state information while in sleep mode.

To exit sleep mode, sleep signal SLEEP is driven to logic low and not sleep signal !SLEEP is driven to logic high. Therefore, N-type transistor 620 is turned off and long-channel weak N-TYPE transistor 630 is turned on. As long as, the saturation current of long-channel weak N-Type transistor 630 is greater than or equal to the combined leakage currents of logic block 320 and N-type transistor 620, long-channel weak N-type transistor 630 can pull the voltage at virtual ground V_GND below isolation voltage V_ISO, at which point isolation NDR isolation device 330, rapidly pulls the voltage of virtual ground node V_GND to ground voltage VSS.

Figure 7:
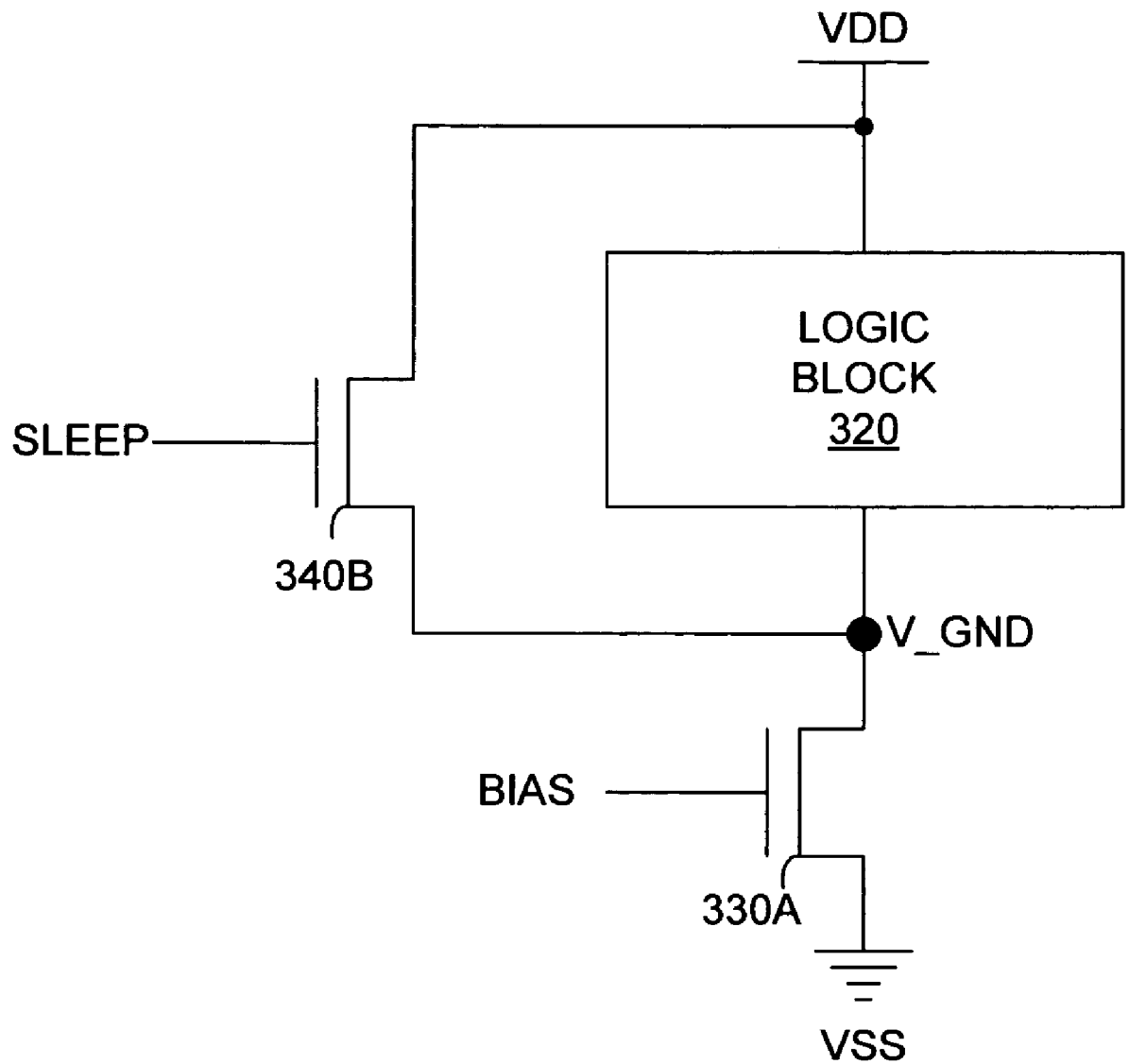
FIG. 7 is a block diagram of another embodiment of the present invention used to reduce sub-threshold leakage current in a logic block during sleep mode.

NDR isolation device 330 can use any variety of NDR devices currently available, such as the NDR transistor described in U.S. Pat. No. 6,512,274. FIG. 7 illustrates the use of the NDR transistor with the embodiment of FIG. 6. As shown in FIG. 7, NDR transistor 330A is coupled between virtual ground node V_GND and ground. Specifically, a first power terminal of NDR transistor 330A is coupled to virtual ground node V_GND and a second power terminal NDR transistor 330A is coupled to ground. A body terminal (not shown) of NDR transistor 330A would also be coupled to ground. A bias signal BIAS is applied to the control terminal of NDR transistor 330A. Bias signal BIAS can be used to control the saturation current I_SAT as described in U.S. Pat. No. 6,512,274. For the present invention, bias signal BIAS is set to a constant value to achieve a desired value for saturation current I_SAT.

In the various embodiments of the present invention, novel structures and methods have been described for minimizing sub-threshold leakage current. The various embodiments of the structures and methods of this invention that are described above are illustrative only of the principles of this invention and are not intended to limit the scope of the invention to the particular embodiments described. For example, in view of this disclosure those skilled in the art can define other NDR isolation devices, virtual ground control devices, logic blocks, bias signals, sleep signals, retention voltages, isolation voltages, isolation currents, and so forth, and use these alternative features to create a method, circuit, or system according to the principles of this invention. Thus, the invention is limited only by the following claims.

What is claimed is:

1. A circuit comprising:
   a logic block coupled to a positive power supply and a virtual ground node;
   an NDR isolation device coupled between the virtual ground node and ground; and
   a virtual ground control device coupled to the positive power supply and the virtual ground node.

2. The circuit of claim 1, wherein the NDR isolation device comprises an NDR transistor having a first power terminal coupled to the virtual ground node and a second power terminal coupled to ground.

3. The circuit of claim 1, wherein the virtual ground control device is configurable to pull a voltage at the virtual ground node above an isolation voltage.

4. The circuit of claim 1, wherein the virtual ground control device is configurable to pull a voltage at the virtual ground node to equal a positive supply voltage.

5. The circuit of claim 1, wherein the virtual ground control device is configurable to pull a voltage at the virtual ground node to equal a positive supply voltage minus a retention voltage.

6. The circuit of claim 5, wherein the retention voltage is greater than a threshold voltage of a plurality of transistors in the logic block.

7. The circuit of claim 1, wherein the NDR isolation device is configured to isolate the virtual ground node from ground when a voltage at the virtual ground is greater than an isolation voltage.

8. The circuit of claim 1, wherein the virtual ground device comprises a pull up device coupled between the positive power supply and the virtual ground node.

9. The circuit of claim 8, wherein the pull up device comprises a P-type transistor having
   a first power terminal coupled to the positive power supply;
   a second power terminal coupled to the virtual ground node; and
   a control terminal coupled to receive a control signal.

10. The circuit of claim 8, wherein the pull up device comprises an N-type transistor having
    a first power terminal coupled to the positive power supply;
    a second power terminal coupled to the virtual ground node; and
    a control terminal coupled to receive a control signal.

11. The circuit of claim 8, wherein the pull up device comprises a plurality of transistors coupled between the positive power supply and the virtual ground node.

12. The circuit of claim 8, wherein the virtual ground device further comprises a pull-down device coupled between the virtual ground node and ground.

13. The circuit of claim 12, wherein the pull-down device is a long-channel weak transistor.

14. The circuit of claim 13, wherein the long-channel weak transistor is an N-type transistor.

15. A method of minimizing sub-threshold leakage current in a logic block; the method comprising:
    raising a voltage at a virtual ground node above an isolation voltage;
    isolating the virtual ground node from ground when the voltage at the virtual ground node is above the isolation voltage; and
    raising the voltage at the virtual ground node to the positive supply voltage minus a retention voltage, wherein the retention voltage is greater than a threshold voltage of a plurality of transistors in the logic block.

16. The method of claim 15, further comprising raising the voltage at the virtual ground node to the positive supply voltage.

17. The method of claim 16, further comprising lowering the voltage at the virtual ground node to a ground voltage.

18. The method of claim 15, further comprising lowering the voltage at the virtual ground node to a ground voltage.

19. A system for minimizing sub-threshold leakage current in a logic block; the system comprising:
    means for raising a voltage at a virtual ground node above an isolation voltage;
    means for isolating the virtual ground node from ground when the voltage at the virtual ground node is above the isolation voltage; and
    means for raising the voltage at the virtual ground node to the positive supply voltage minus a retention voltage, wherein the retention voltage is greater than a threshold voltage of a plurality of transistors in the logic block.

20. The system of claim 19, further comprising means for raising the voltage at the virtual ground node to the positive supply voltage.

21. The system of claim 20, further comprising means for lowering the voltage at the virtual ground node to a ground voltage.

22. The system of claim 19, further comprising means for lowering the voltage at the virtual ground node to a ground voltage.

* * * * *